United States Patent
Fang et al.

(10) Patent No.: US 6,556,752 B2
(45) Date of Patent: Apr. 29, 2003

(54) DUAL THERMOELECTRIC COOLER OPTOELECTRONIC PACKAGE AND MANUFACTURE PROCESS

(75) Inventors: Lu Fang, Orefield, PA (US); Joseph Edward Riska, Macungie, PA (US); John W. Herman, Binghamton, NY (US); Timothy Butrie, Orefield, PA (US); Rory Keene Schlenker, Lenharrsville, PA (US)

(73) Assignee: Agility Communications, Inc., Goleta, CA (US)

(*) Notice: Subject to any disclaimer, the term of this patent is extended or adjusted under 35 U.S.C. 154(b) by 0 days.

(21) Appl. No.: 09/946,775

(22) Filed: Sep. 4, 2001

(65) Prior Publication Data
US 2003/0036303 A1 Feb. 20, 2003

Related U.S. Application Data
(60) Provisional application No. 60/312,956, filed on Aug. 15, 2001.

(51) Int. Cl.$^7$ .............................. G02B 6/26; G02B 6/42
(52) U.S. Cl. ................. 385/52; 62/3.7; 62/3.2
(58) Field of Search ............... 385/52; 62/3.7, 62/3.2

(56) References Cited

U.S. PATENT DOCUMENTS

| | | | | |
|---|---|---|---|---|
| 2,978,570 A | | 4/1961 | Hanlein | |
| 5,171,372 A | | 12/1992 | Recine, Sr. | |
| 5,522,225 A | * | 6/1996 | Eskandari | 136/230 |
| 5,576,512 A | * | 11/1996 | Doke | 136/203 |
| 5,612,593 A | * | 3/1997 | Olson | 313/13 |
| 5,704,213 A | * | 1/1998 | Smith et al. | 165/290 |
| 5,734,771 A | * | 3/1998 | Huang | 385/93 |
| 5,737,349 A | * | 4/1998 | Gaebe | 372/106 |
| 5,837,929 A | | 11/1998 | Adelman | |
| 5,924,290 A | * | 7/1999 | Yoshino | 62/3.7 |
| 5,927,077 A | * | 7/1999 | Hisai et al. | 219/444.1 |
| 6,043,982 A | * | 3/2000 | Meissner | 257/930 |

OTHER PUBLICATIONS

Marlow Industries, Inc., "Thermoelectric Cooling Systems Design Guide," Publication No. 017–7939 Rev 2, 1998, 22 pp.

* cited by examiner

Primary Examiner—Lynn D. Feild
Assistant Examiner—Brian S. Webb
(74) Attorney, Agent, or Firm—Gates & Cooper LLP

(57) ABSTRACT

An optoelectronic device comprising a laser and a lens for generating collimated light, a locker including an etalon for wavelength locking the collimated light, a first thermoelectric cooler coupled to the laser, and a second thermoelectric cooler coupled to the locker, wherein the first and second thermo-electric coolers are independently controlled and the second thermo-electric cooler provides for temperature tuning of the etalon.

6 Claims, 3 Drawing Sheets

DUAL THERMOELECTRIC COOLER OPTOELECTRONIC PACKAGE AND MANUFACTURE PROCESS

This application claims the benefit of provisional application No. 60/312,956, filed Aug. 15, 2001.

BACKGROUND OF THE INVENTION

1. Field of the Invention

This invention relates to microelectronic and optoelectronic packaging. More particularly the present invention relates to an integrated dual thermoelectric cooler and a method of manufacture.

2. Brief Description of the Related Art

A thermoelectric cooler (TEC), or Peltier cooler has been widely used in optoelectronic and microelectronic industries for many years. TEC maintains devices such as laser, CCD, and microprocessor at temperatures at which the devices perform the best. When multiple devices are assembled in one enclosure, especially when optical alignment among the devices is critical, however, packaging design and processing become complicated.

Maintaining a device at its best performing temperature, while being able to vary temperatures of other devices is a key application of the current invention. A thermoelectric cooler functions based upon the Peltier effect—a phenomenon discovered in early $19^{th}$ century that, accompanying electric current flow through conductors, heat flows in the direction of charge carriers. As depicted in FIG. 1, the electric-flow induced thermal flow is more pronounced in circuits containing DC power supply and dissimilar conductors as shown in FIG. 1. In n-type conductors, electrons are charge carriers flowing from negative pole of DC power supply through conductors A and B to the positive pole. Heat flows from the bottom of conductor B to its top, hence the term heat pump. In p-type conductor, holes are charge carriers; holes and heat flow from the end linked to positive pole of power supply to the end that is connected to the negative pole.

In circuits that contain both n- and p-type conductors in series, electrons and holes flow in opposite directions, as shown in FIG. 2. Heat flows from the bottom to the top in both B and C conductors resulting in constructive heating and cooling effect. When many of these thermal couples are assembled together in series electrically and in parallel thermally; the product, thermoelectric cooler, has enough heating and cooling power for engineering applications.

TECs typically require 3 to 10 V and 1 to 2 A DC power to achieve 60 to 80° C. ΔT cooling. ΔT, temperature differential between cold and hot side of TE cooler, is a measure of the cooling power of TEC.

Space is at a premium in optoelectronic packaging. As such, what is needed in the art is a TEC that takes up a minimum of space, that can provide multiple controls along its length, and is easily manufactured and maintained.

Thus, what is needed in the art is a multiple-TEC concept that encompasses TEC design, manufacturing, and applications. This concept simplifies multiple-TEC design and manufacturing process; it also enhances optoelectronic device packaging process flexibility. Additionally, the overall component assembly time and cost are reduced, and the quality and reliability of the component assembly is increased.

SUMMARY

An object of the invention is to provide a process for thermal control of a plurality of separate components that can be accomplished by a single TEC assembly.

Another object of the present invention is to provide a process for thermal control that minimizes the risk of potential failure.

And yet another object of the present invention is to provide a TEC the configuration of which has a consistent optical centerline.

Another object of the invention is to provide for reduced assembly time, reduced cost, and increased quality and reliability of a TEC.

Other objects, advantages, and novel features of the present invention will become apparent from the following detailed description of the invention when considered in conjunction with the accompanying drawings and the following detailed description, in which like reference numerals refer to like parts and where:

DETAILED DESCRIPTION

Figure 1:
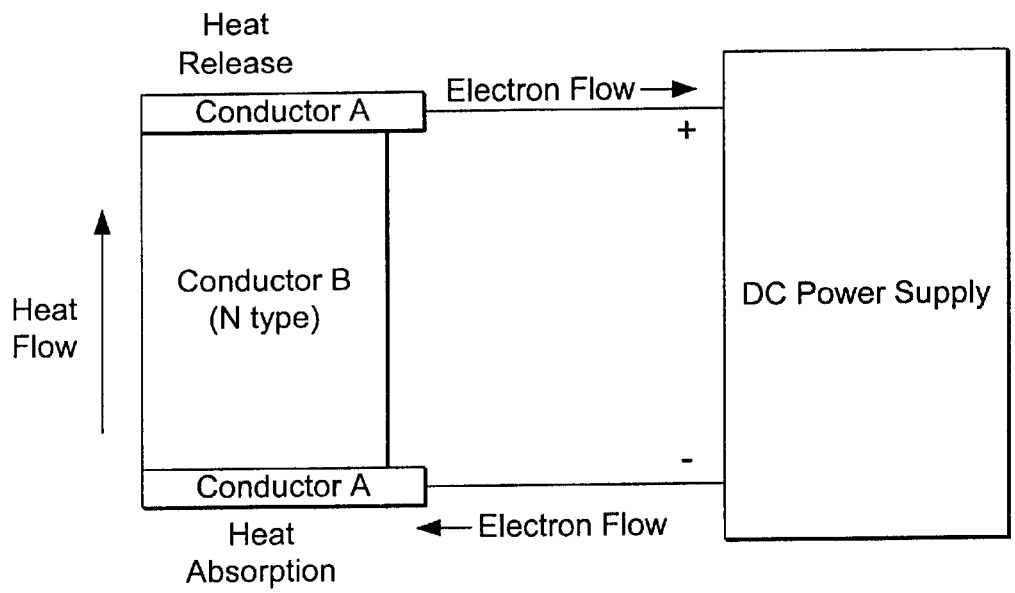
FIG. 1 is a schematic diagram of a one thermal element circuit.
Figure 2:
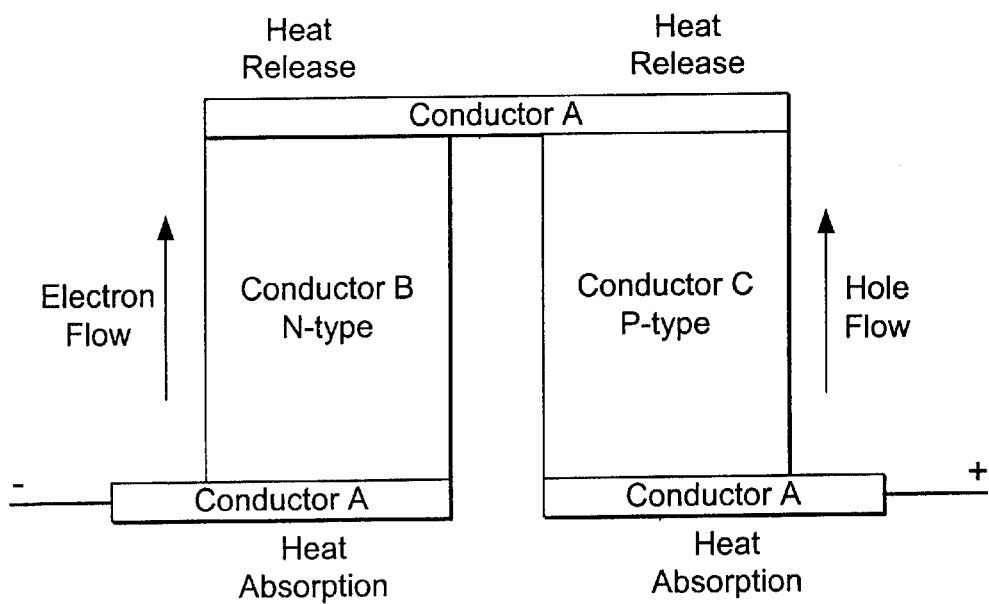
FIG. 2 is a schematic diagram of a one thermal couple circuit.
Figure 3:
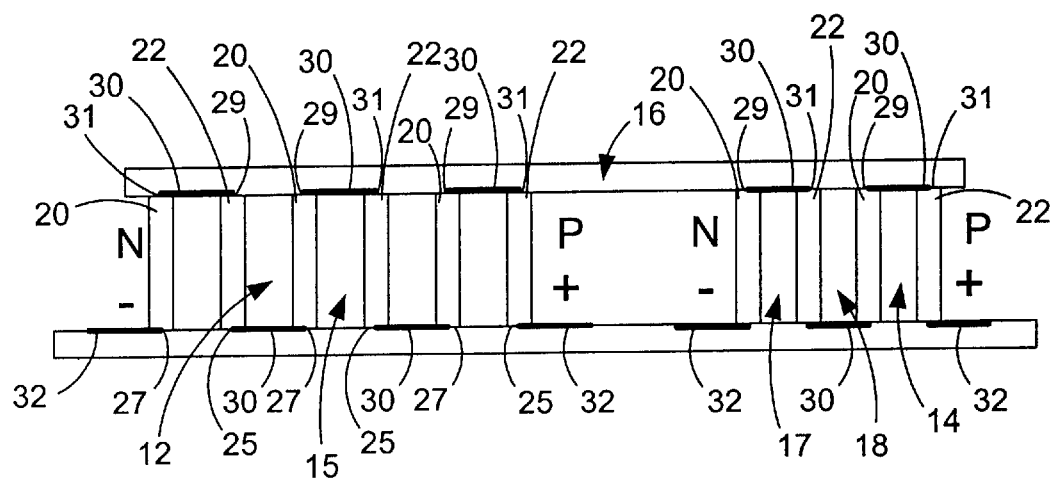
FIG. 3 is a schematic diagram of many thermal couples assembled together to form a thermoelectric cooler.
Figure 4:
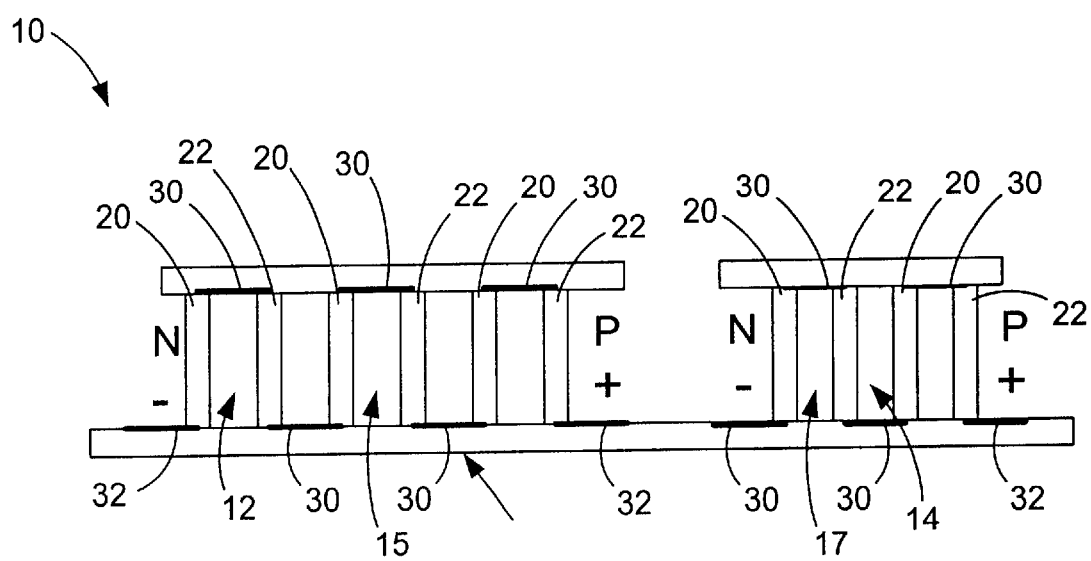
FIG. 4 is a schematic of a twin-TEC in accordance with the present invention including a bifurcated cold side ceramic plate.

The conflict between thermal requirements and optical alignment needs prompted the current inventors to propose a twin-TEC 10, shown in FIGS. 3 and 4. Two partial circuits 12, 14 can be patterned and metallized on upper and lower plates or more generally heat dissipating and heat gathering plates, 16 and 18 respectively. The plates 16 and 18 are preferably formed from ceramic, although other materials, known to those skilled in the art may be used, including various thermal conductors that are not electrically conducting. After placing and soldering a plurality of thermal couples between the plates, a super thermoelectric cooler with two complete sets of TEC is made. By removing a strip of ceramic from the top plate by cutting, slicing, etching, or a variety of other means for removing a portion of the heat dissipating plate 16, a twin-TEC 10 is formed.

Since the twin-TEC 10 is initially built as one part, the two separate coolers, or cooling circuits 15, 17 have substantially identical heights. The two separate circuits 15, 17 allow components on each of them to be regulated somewhat independently.

People familiar with the art understand that TEC manufacturing is a manually intensive process. The process starts with plates 16, 18 that have partial circuits 30 formed with metallization traces (patterns or art-works). N-type 20 and P-type 22 elements, which appear identical to the eyes, are placed at their respective correct locations and are attached to the bottom plate by soldering, epoxying or some other method well-known to those skilled in the art. Each of the N-type elements 20 have a top surface 31 and a bottom surface 27. Each of the P-type elements 22 have a top surface 29 and a bottom surface 25. Traces on the top plate 16 are matched and soldered to the top surfaces 29, 31 of each of the elements 20, 22 that are to be in electrical communication with another element 20, 22. Traces on the bottom plate 18 are matched and soldered to the bottom surfaces 25, 27 of each of the elements 20, 22 that are to be in electrical communication with a corresponding element 20, 22. It is generally understood by those in the art that a corresponding element for an N-type 20 element is a P-type element 22 and vice versa.

Terminal leads 32 or posts are then bonded, generally by soldering, epoxying or some other well-known method, typically on the bottom plate, to complete the TEC circuit. Solder alloys can be pre-deposited on top and bottom surfaces of TEC.

Thick and thin film technologies have adequate lateral precision and tolerance for making traces in the partial circuits patterned on the upper and lower ceramic plates 16, 18. The choice of one technology over the other comes from process capability, material compatibility, and cost considerations. Thick film processes can be used on aluminum oxide ceramics, while thin film technology is used on aluminum nitride materials.

Placing and soldering elements to the bottom ceramic plate is probably the most tedious process step in making of TEC. Using twin-TEC design and manufacturing concept illustrated in FIG. 4, complexity level of making the twin-TEC 10 remains the same as that of making regular TEC. The height of the twin-TEC 10 is always consistent. Obviously, there is no limit of the number of TECs that can be constructed as one piece using this technique. Therefore, a plurality of TEC circuits may be formed, thus creating a multi-TEC assembly.

In application, when temperatures of each of the TECs in a multi-TEC assembly are not too far apart, thermal interaction of the multi-TEC is negligible i.e., each of the coolers function substantially independent from each other. For optoelectronic applications, this implies that components on the two TEC can be maintained at temperatures of up to about 50° C. apart, which is very significant for many applications.

Figure 5:
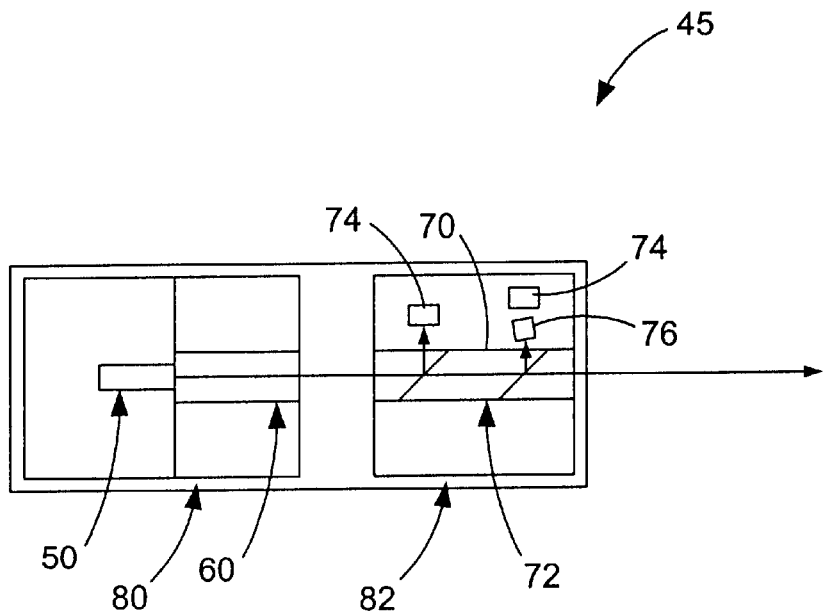
FIG. 5 is at top down view of an optoelectronic package containing laser, lens, and locker and the twin TEC.

Take a simplified optoelectronic package 45 with laser 50, lens 60, and internal locker 70 as an example. A top-down plan view of such a package 45 is shown in FIG. 5. The laser 50 and lens 60 are attached to TEC1 80. The lens 60 collimates light emitted from the laser 50. The locker 70, which contains a beam splitter 72, two photo-detectors 74, such as PINs or APDs, or some other well known photo detector and an etalon 76, is attached to TEC2 82. The two beam splitting surfaces tap a small percentage of light into the photodetector 74. The first beam is for reference, the second beam passes through the etalon 76 and reaches the second photodetector with a phase shift for wavelength-locking purposes.

Phase change, Φ, through etalon is described by equation (1)

$$\Phi = \frac{4\pi n L \cos\theta}{\lambda} \quad (1)$$

where λ is wavelength of light, n is the index of refraction of the material between the mirrors, L is the distance between the mirrors, and θ is the incident angle of light beam.

Ideally, θ should be zero. In manufacturing, the etalon will always deviate from its ideal position. Typical incident angle to etalon surfaces, θ, ranges from 0.5 to 1.00 at three times standard deviation.

Temperature tuning becomes a powerful tool to compensatel etalon misalignment. From equation (1), one finds phase change as a function of temperature, T, as $$\frac{d\Phi}{dT} = \frac{4\pi\cos\theta}{\lambda}\left(L\frac{\partial n}{\partial T} + n\frac{\partial L}{\partial T}\right) \quad (2)$$

ignore the less sensitive term, $$n\frac{\partial L}{\partial T},$$

and rearrange, the relationship between incident angle and temperature change is $$\Delta T = \frac{n\left(\frac{1}{\cos\theta} - 1\right)}{\frac{dn}{dT}} \quad (3)$$

Figure 6:
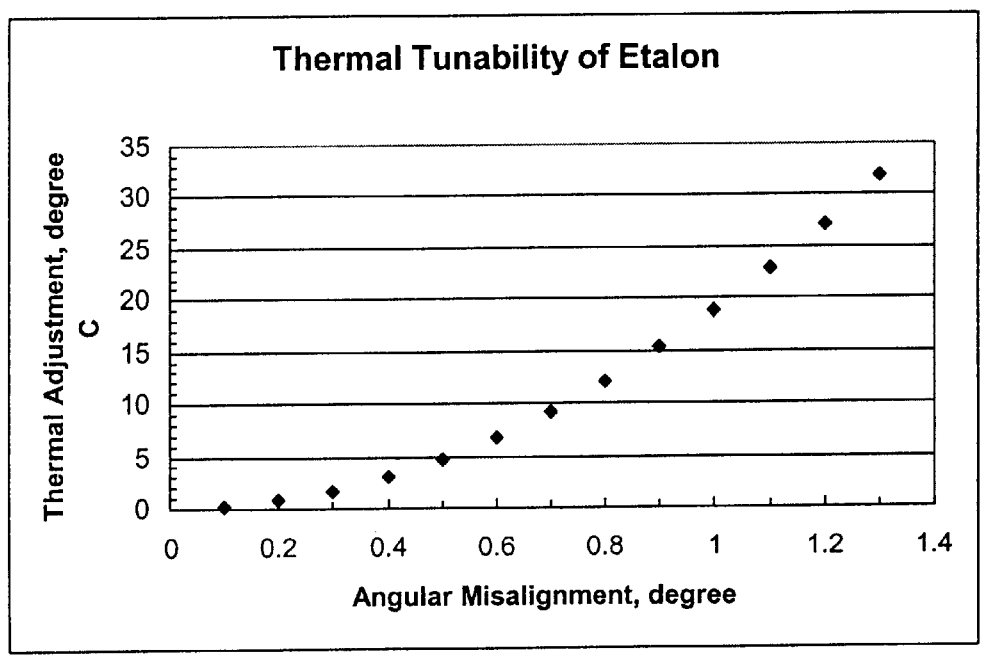
FIG. 6. Relationship between Etalon angular misalignment and temperature adjustment.

Knowing optical properties of an etalon material, one can calculate the temperature change needed to compensate a certain angular misalignment. For fused silica, n=1.44, $$\frac{dn}{dT} = 1.16 \times 0^{-5},$$

the relationship between angular misalignment of fused silica-etalon and temperature change is depicted in FIG. 6. To compensate a 1° Etalonmisalignment, one can heat the etalon by 19° C. using TEC2 above room (or reference) temperature.

The arrangement shown in FIG. 5 can also be used for tuning an-etalon to lock on different wavelength if the laser is tunable.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An optoelectronic device, comprising:
   (a) a laser and a lens for generating collimated light;
   (b) a locker including an etalon for wavelength locking the collimated light;
   (c) a first thermo-electric cooler coupled to the laser; and
   (d) a second thermo-electric cooler coupled to the locker;
   (e) wherein the first and second thermo-electric coolers are independently controlled and the second thermo-electric cooler provides for temperature tuning of the etalon.

2. The optoelectronic device of claim 1, wherein the temperature tuning is performed to compensate for etalon misalignment.

3. The optoelectronic device of claim 1, wherein the temperature tuning is performed to lock on a different wavelength when the laser is tunable.

4. The optoelectronic device of claim 1, wherein the locker splits a beam from the collimated light that passes through the etalon with a phase change.

5. The optoelectronic device of claim 1, wherein a relationship between an incident angle $\theta$ of the beam to the etalon's surfaces and a temperature change $\Delta T$ is:

$$\Delta T = \frac{n\left(\frac{1}{\cos\theta} - 1\right)}{\frac{dn}{dT}}$$

where n is an index of refraction for the etalon and T is a temperature.

6. The optoelectronic device of claim 5, wherein n is 1.44 and $$\frac{dn}{dT} \text{ is } 1.16 \times 10^{-5}$$

for fused silica.

* * * * *

UNITED STATES PATENT AND TRADEMARK OFFICE
CERTIFICATE OF CORRECTION

PATENT NO. : 6,556,752 B2
DATED : April 29, 2003
INVENTOR(S) : Lu Fang et al.

It is certified that error appears in the above-identified patent and that said Letters Patent is hereby corrected as shown below:

<u>Title page,</u>
Item [56], References Cited, U.S. PATENT DOCUMENTS,
Delete "5,924,290 A * 7/1999 Yoshino ................. 62/3.7"

Signed and Sealed this

Twenty-fifth Day of November, 2003

JAMES E. ROGAN
*Director of the United States Patent and Trademark Office*